United States Patent
Claverie

(10) Patent No.: US 6,306,717 B1
(45) Date of Patent: Oct. 23, 2001

(54) METHOD OF MANUFACTURING AN AVALANCHE DIODE WITH AN ADJUSTABLE THRESHOLD

(75) Inventor: Isabelle Claverie, Greasque (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/282,025

(22) Filed: Mar. 30, 1999

(30) Foreign Application Priority Data

Mar. 31, 1998 (FR) .................................................. 98 04207

(51) Int. Cl.$^7$ .................................................... H01L 21/20
(52) U.S. Cl. ........................ 438/380; 438/383; 438/395; 438/413
(58) Field of Search .................................... 438/380, 383, 438/394, 395, 413

(56) References Cited

U.S. PATENT DOCUMENTS 4,064,620 * 12/1977 Lee et al. .................................. 357/58
4,416,708    11/1983 Abdoulin et al. ........................ 148/187
5,032,534     7/1991 Ducreux .................................... 437/27

FOREIGN PATENT DOCUMENTS

| 57122579 | 7/1982 | (JP) . |
| 59079578 | 5/1984 | (JP) . |
| 59079578 | * 8/1984 | (JP) . |

* cited by examiner

*Primary Examiner*—Charles Bowers
*Assistant Examiner*—Yennhu B. Huynh
(74) *Attorney, Agent, or Firm*—Theodore E. Galanthay; E. Russell Tarleton; Seed IP Law Group PLLC

(57) ABSTRACT

The present invention relates to a method of manufacturing an avalanche diode of determined threshold in a substrate of a first conductivity type with a low doping level, including the steps of diffusing in the substrate at least one first region of the first conductivity type; diffusing in the substrate a second region of the second conductivity type protruding from the first region. The opening of a mask of definition of the first region has a lateral extent smaller than the diffusion depth of the first region in the substrate, this lateral extent being chosen all the smaller as the desired avalanche threshold is high.

6 Claims, 3 Drawing Sheets

METHOD OF MANUFACTURING AN AVALANCHE DIODE WITH AN ADJUSTABLE THRESHOLD

TECHNICAL FIELD

The present invention relates to the manufacturing of avalanche diodes in integrated circuits, for example, power integrated circuits.

BACKGROUND OF THE INVENTION

In such circuits, it is often required to define several triggering thresholds, for example, to create various devices of protection against electrostatic discharges, battery inversions, or others.

Generally, as shown in FIG. 1, an avalanche diode is made by forming in a substrate 1 of a first conductivity type a region 2 of the opposite conductivity type. It should be noted that "substrate" is here used to designate a region or upper layer of a semiconductor component, for example, an integrated circuit. Region 2 generally is heavily doped and the breakdown threshold of the avalanche diode is essentially determined by the doping level of substrate 1 (the less the substrate is doped, the higher the breakdown voltage of the device).

FIG. 2 shows another example of an avalanche diode currently used in integrated circuits. In substrate 1 of the first conductivity type, a diffused (or implanted-diffused) region 3 of the same conductivity type is created. A region 2 of the opposite conductivity type is formed to laterally protrude from region 3 to obtain a breakdown independent from edge and surface effects. Assuming that substrate 1 of FIG. 2 is the same as that of FIG. 1, the avalanche voltage of junction 2-3, which depends on the doping level of region P, necessarily is lower than that of junction 2-1 since the concentration of region 3 at its junction with region 2 necessarily is higher than that of region 1.

Thus, generally, in any method of manufacturing of a semiconductor component or of an integrated circuit, the various types of diffusion provided for the manufacturing of other components of the integrated circuit can be used to form avalanche diodes. However, the breakdown thresholds of the various diodes are determined without any possible choice by the doping level of the existing regions and, in many simple lines of manufacturing of integrated circuits such as power integrated circuits, there are only the two possibilities, which are illustrated in FIGS. 1 and 2.

Thus, in an existing device, to obtain a diode with a specific avalanche threshold, a specific diffused region 3 should be provided, that is, a region with a specific implantation dose or a specific anneal duration. It is of course impossible in an integrated circuit to provide an area with a specific anneal duration since the anneal performed for this area would react upon the other areas of the integrated circuit. On the other hand, to perform this implantation at a specific dose would increase the number of integrated circuit manufacturing steps, which is always attempted to be avoided in an existing line.

SUMMARY OF THE INVENTION

Thus, an object of the present invention is to provide a method of manufacturing an avalanche diode of selected threshold, distinct from the thresholds naturally existing by using the existing junctions of that process, this threshold being choosable without adding any additional processing step to the existing steps.

To achieve these objects, the present invention provides a method of manufacturing an avalanche diode of determined threshold in a substrate of a first conductivity type with a low doping level, including the steps of diffusing in the substrate at least one first region of the first conductivity type; diffusing in the substrate a second region of the second conductivity type protruding from the first region. The opening of a mask of definition of the first region has a lateral extent smaller than the diffusion depth of the first region in the substrate, this lateral extent being chosen smaller corresponding to as the desired avalanche threshold being higher.

According to an embodiment of the present invention, each diffusion is preceded by an implantation.

According to an embodiment of the present invention, each first region includes a plurality of separate and identical sub-regions.

The present invention also provides a method of simultaneously manufacturing several avalanche diodes of distinct and determined thresholds in a substrate of a first conductivity type of low doping level including the steps of diffusing in the substrate first regions of the first conductivity type; diffusing in the substrate second regions of the second conductivity type, each of which protrudes from a first region. The openings of the masks of definition of each of the first regions have lateral extents smaller than the diffusion depths of the first regions, the lateral extent being smaller corresponding to as the desired avalanche threshold being higher.

The foregoing objects, features and advantages of the present invention will be discussed in detail in the following non-limiting description of specific embodiments in connection with the accompanying drawings.

DETAILED DESCRIPTION OF THE INVENTION

Figure 3A:
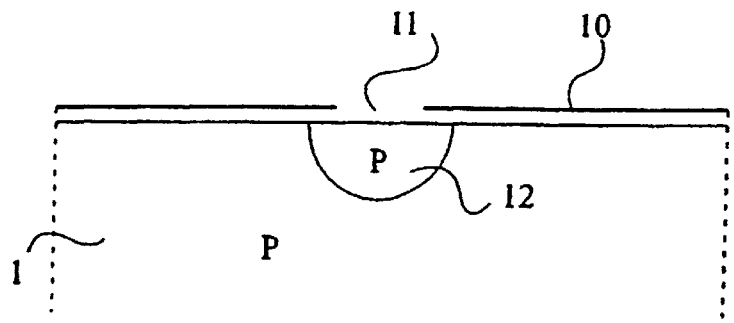
FIGS. 3A and 3B illustrate steps of the making of an avalanche diode according to the present invention.

FIG. 3A shows a first step of manufacturing of an avalanche diode according to the present invention. The structure is formed in a substrate 1 of a first conductivity type which will be considered hereafter as an example as type P. An implantation mask 10 comprising an opening 11 is formed on this substrate. A P-type doping is implanted in this substrate, then made to diffuse to form a P-type region 12 more heavily doped than the substrate. The opening in mask 11 is chosen to be smaller than the diffusion depth of region 12.

At a following step, a heavily-doped N-type region 13 protruding from region 12 is implanted and diffused. A larger opening in a separate mask is used to form the region 13.

Figure 1:
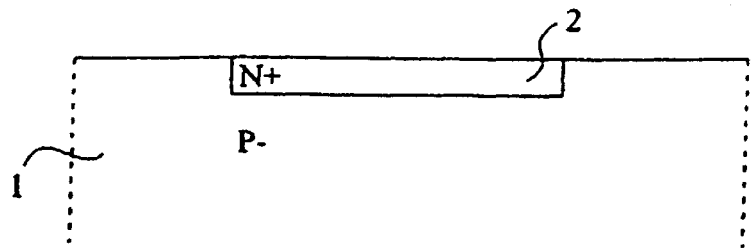
FIGS. 1 and 2 show avalanche diodes according to prior art.
Figure 2:
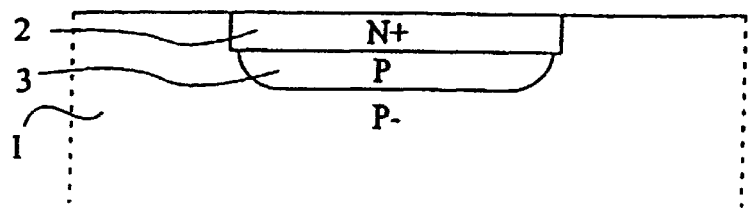

Given that the lateral dimension of opening 11 in mask 10 is smaller than the diffusion depth of the P region, the diffusion of the dopants from the implanted area is as large laterally as in depth. Thus, at the level of the deep portion of region 12 and more specifically at the level of its interface with region 13, this region is more lightly doped than in the case of layer 3 of FIG. 2 which has a much larger width than its depth. This is because the doping at the interface is lighter corresponding to opening 11 being smaller. A means for adjusting the doping level of region 12 at its junction with region 13 is thus available. An avalanche diode is thus obtained between regions 13 and 12, with an intermediary avalanche voltage between that of the avalanche diodes of FIGS. 1 and 2. Further, this avalanche diode has an adjustable threshold which depends on the size of opening 11 in mask 10. Several avalanche diodes may be simultaneously formed in substrate 1, some having the threshold corresponding to FIG. 1, others having the threshold corresponding to FIG. 2, and others still, according to the present invention, having selected thresholds intermediary between those of the structures of FIGS. 1 and 2.

Figure 3B:
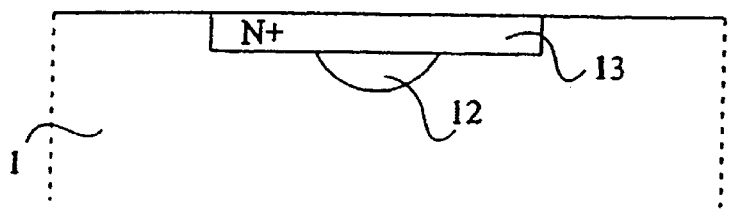

An embodiment of the present invention will be described in further detail in relation with FIGS. 4A to 4C in the context of a technology of manufacturing of power MOS transistors associated with logic circuits, in which the structure is formed on an N-type heavily-doped silicon wafer 20 on which is formed an N-type epitaxied layer 21. A P-type well 22 which, in the context of the manufacturing of power MOS transistors associated with logic circuits, corresponds to the diffusion in which are formed the wells of the logic circuits is formed in this epitaxied layer. This well diffusion corresponds to substrate 1 of FIGS. 1 to 3. In this well, through a mask 23 having an opening 24 of reduced size, a P-type doping such as boron is implanted, this doping step corresponding for example to the formation of DMOS-type transistor wells in the power portion of the circuit. After anneal, a diffused region 25 similar to region 12 of FIG. 3A is obtained. Then, as shown in FIG. 4B, the formation of a heavily-doped N-type layer 27 which for example corresponds to the source regions of DMOS transistors is performed through mask 26. Finally, as shown in FIG. 4C, an insulating oxide 28 is deposited, a P-type heavily-doped region contact recovery 29 is formed on region 22, after which cathode metallizations K are formed on region 29 and anode metallizations A are formed on region 27.

While the junction between region 27 and region 22 would have in a specific manufacturing method a known breakdown voltage in one example of 20 volts, and the junction between the N$^+$ region and an extensive region 25 would have a known breakdown voltage, in one example on the order of 7 volts, a diode of breakdown voltage chosen between these two values may be obtained according to the size of opening 24.

Figure 4A:
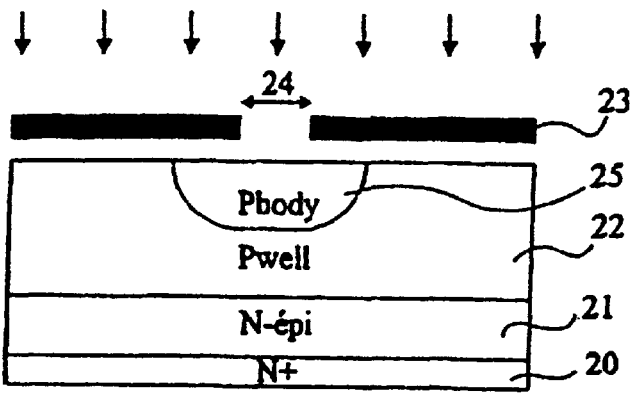
FIGS. 4A to 4C illustrate steps of the making of an avalanche diode according to the present invention.
Figure 4B:
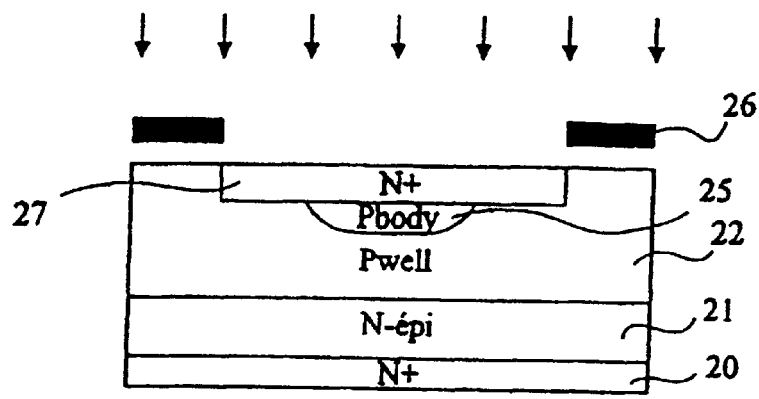
Figure 4C:
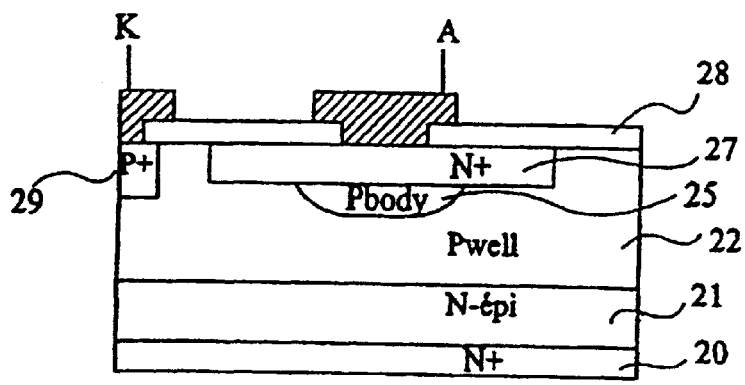
Figure 5A:
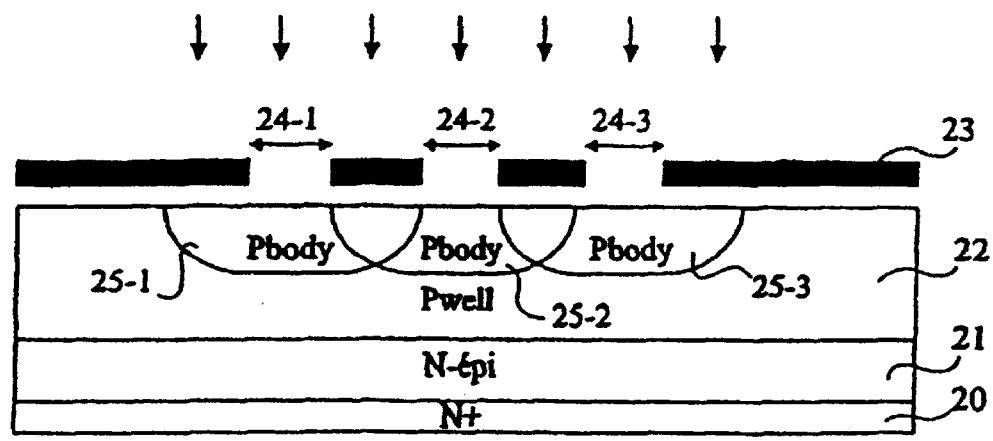
FIGS. 5A and 5B illustrate steps of the making of an avalanche diode according to the present invention.
Figure 5B:
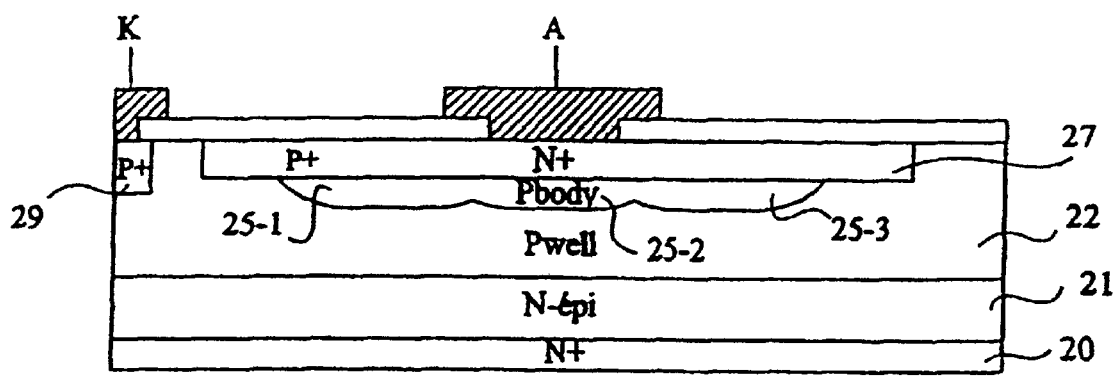

FIGS. 5A, 5B illustrate an alternative embodiment of the present invention shown in the context of the embodiment of FIGS. 4A–4C.

Instead of forming a single opening 24 in mask 23, several openings 24-1, 24-2, 24-3 are formed to form several identical regions 25-1, 25-2, 25-3, which intersect due to the choice of a small spacing between the openings. As shown in FIG. 5B, an avalanche diode of chosen threshold but of larger surface, to let through higher currents, may then be obtained.

Although the present invention has been described in the context of specific embodiments, it also applies to the formation of P$^+$-N-type avalanche diodes. For example, by diffusion in epitaxied layer 21, at a location where it is apparent at the substrate surface. In the specific case where a P$^+$ diffusion in this epitaxied layer would form a diode of avalanche voltage on the order of 35 volts, avalanche diodes of any value greater than 35 volts may be formed, by diffusing one or several regions of type N through a mask with narrow openings, and by then forming a P$^+$-type anode layer.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of manufacturing an avalanche diode of determined threshold in a substrate of a first conductivity type with a low doping level, including the steps of:

diffusing in the substrate at least one first region of the first conductivity type;

diffusing in the substrate a second region of an second conductivity type protruding from the first region;

wherein an opening of a mask of definition of the first region has a lateral extent smaller than the diffusion depth of the first region in the substrate, this lateral extent being chosen all the smaller as the desired avalanche threshold is high.

2. The method of claim 1 wherein each diffusion is preceded by an implantation.

3. The method of claim 1 wherein each first region includes a plurality of separate and identical sub-regions.

4. A method of simultaneously manufacturing several avalanche diodes of distinct and determined thresholds in a substrate of a first conductivity type of low doping level including the steps of:

diffusing in the substrate first regions of the first conductivity type;

diffusing in the substrate second regions of the second conductivity type, each of which protrudes from a first region;

wherein the openings of the masks of definition of each of the first regions have lateral extents smaller than the diffusion depths of the first regions, the lateral extent being all the smaller as the desired avalanche threshold is high.

5. The method according to claim 4 wherein the openings of the masks of definition of the first region includes at least two openings of a different size from each other so as to provide two distinct avalanche diodes having different thresholds from each other.

6. The method according to claim 5 wherein the first one of the two avalanche diodes has a selected first threshold and the second, higher threshold and both avalanche diodes were formed in simultaneous manufacturing steps with the second avalanche diode having a mask opening smaller than the mask opening for first avalanche diode.

* * * * *